(12) United States Patent
Cross et al.

(10) Patent No.: US 8,524,100 B2
(45) Date of Patent: Sep. 3, 2013

(54) PROCESS AND SYSTEM FOR FABRICATION OF PATTERNS ON A SURFACE

(75) Inventors: Graham L. W. Cross, Sidney (CA); Warren McKenzie, Wilberforce (AU); John B. Pethica, Oxford (GB)

(73) Assignee: The Provost Fellows and Scholars of the College of the Holy and Undivided Trinity of Queen Elizabeth, near Dublin, Dublin (IE)

( * ) Notice: Subject to any disclaimer, the term of this patent is extended or adjusted under 35 U.S.C. 154(b) by 0 days.

(21) Appl. No.: 13/003,484

(22) PCT Filed: Jul. 3, 2009

(86) PCT No.: PCT/EP2009/004846
§ 371 (c)(1),
(2), (4) Date: Apr. 25, 2011

(87) PCT Pub. No.: WO2010/003600
PCT Pub. Date: Jan. 14, 2010

(65) Prior Publication Data
US 2011/0189446 A1    Aug. 4, 2011

Related U.S. Application Data

(60) Provisional application No. 61/079,895, filed on Jul. 11, 2008.

(30) Foreign Application Priority Data

Jul. 11, 2008   (EP) ..................................... 08104722

(51) Int. Cl.
*C03C 15/00*   (2006.01)
(52) U.S. Cl.
USPC .............................................. 216/62; 216/58
(58) Field of Classification Search
None
See application file for complete search history.

(56) References Cited

U.S. PATENT DOCUMENTS 4,377,437 A    3/1983    Taylor et al.
4,622,918 A    11/1986   Bok
(Continued)

FOREIGN PATENT DOCUMENTS

EP    0148448 A2    7/1985
EP    0321144 A2    6/1989
(Continued)

OTHER PUBLICATIONS

Hadjichristov et al. "Reflectivity modification of polymethylmethacrylate by silicon ion implantation", Applied Surface Science, vol. 254, 2008, pp. 4820-4827.*

(Continued)

*Primary Examiner* — Shamim Ahmed
*Assistant Examiner* — Bradford Gates
(74) *Attorney, Agent, or Firm* — K&L Gates LLP (57) ABSTRACT

The invention provides a system and process of patterning structures on a carbon based surface comprising exposing part of the surface to an ion flux, such that material properties of the exposed surface are modified to provide a hard mask effect on the surface. A further step of etching unexposed parts of the surface forms the structures on the surface. The inventors have discovered that by controlling the ion exposure, alteration of the surface structure at the top surface provides a mask pattern, without substantially removing any material from the exposed surface. The mask allows for subsequent ion etching of unexposed areas of the surface leaving the exposed areas raised relative to the unexposed areas thus manufacturing patterns onto the surface. For example, a Ga+ focussed ion beam exposes a pattern onto a diamond surface which produces such a pattern after its exposure to a plasma etch. The invention is particularly suitable for patterning of clear well-defined structures down to nano-scale dimensions.

16 Claims, 5 Drawing Sheets

(56) References Cited

U.S. PATENT DOCUMENTS

| | | | |
|---|---|---|---|
| 4,880,493 A | | 11/1989 | Ashby et al. |
| 5,334,283 A | * | 8/1994 | Parikh et al. ............ 216/81 |
| 5,580,419 A | | 12/1996 | Berenz |
| 5,705,404 A | | 1/1998 | Huber et al. |
| 5,962,194 A | | 10/1999 | Komatsu et al. |
| 6,635,185 B2 | * | 10/2003 | Demmin et al. ............ 216/64 |
| 7,094,622 B1 | * | 8/2006 | Cui et al. ............ 438/57 |
| 2008/0038926 A1 | | 2/2008 | Ventzek et al. |
| 2011/0003252 A1 | * | 1/2011 | Singh et al. ............ 430/296 |

FOREIGN PATENT DOCUMENTS

| | | |
|---|---|---|
| EP | 0400791 A2 | 12/1990 |
| EP | 1973148 A2 | 9/2008 |
| JP | 63281488 A | 11/1988 |
| WO | 03056611 A2 | 7/2003 |

OTHER PUBLICATIONS

Sandia National Laboratory, "Accelerated Ions Create Semiconductor Etching Masks," 2301 NTIS Tech Notes, U.S. Dept of Commerce, Aug. 1988, pp. 640-641.

Brugger et al., "Silicon Micro/Nanomechanical Device Fabrication Based on Focused Ion Beam Surface Modification and KOH Etching," Microelectronic Engineering, 35(1):401-404, Feb. 1, 1997.

Rennon et al., "Nanoscale patterning by focused ion beam enhanced etching for optoelectronic device fabrication," Microelectronic Engineering, 57-58:891-896, Sep. 1, 2001.

Wang et al., "Role of native oxide layers in the patterning of InP by Ga ion beam writing and ion beam assisted Cl2 etching," Applied Physics Letters 56(8):749-751, Feb. 19, 1990.

Robertson, "Diamond-like amorphous carbon," Materials Science and Engineering Reviews, 37:129-281 (2002).

\* cited by examiner

PROCESS AND SYSTEM FOR FABRICATION OF PATTERNS ON A SURFACE

CROSS-REFERENCE TO RELATED APPLICATIONS

This application is a national phase application under 35 U.S.C. §271 of international application no. PCT/EP2009/004846, filed on Jul. 3, 2009, which claims priority to and the benefit of U.S. provisional patent application No. 61/079,895, filed on Jul. 11, 2008, and EP 08104722.7, filed on Jul. 11, 2008, the entire contents of each of which are hereby incorporated by reference herein.

FIELD OF THE INVENTION

The invention relates to a system and process for the fabrication of patterns on a mechanically hard surface and in particular carbon based surfaces. In particular the invention provides a system and process for the fabrication of sharp, precise and high aspect ratio three dimensional patterns on a surface, for example a surface of a diamond, with dimensions ranging from nanometers to centimeters.

BACKGROUND TO THE INVENTION

It is known to provide Patterning for Nanoimprint Lithography (NIL) of surfaces, including diamond flat surfaces. A problem with patterning diamond surfaces is that it is very difficult to create complex nano-scaled structures on diamond surfaces, particularly for features such as, any surface pattern more complex than a straight line or mesas or line structures with extreme surface smoothness. It is especially problematic for nano-structures that require the characteristics of smooth vertical side walls, and a high height to width aspect ratio.

Typically to provide conventional patterning of diamond surface a process called direct Focused Ion Beam (FIB) is used, usually of the order pico or micro amps over an area of 100 nm$^2$. A number of papers disclose a process for diamond patterning for subsequent use in NIL. For example, a paper published by Taniguchi J., Tokano Y., Miyamoto I., Komuro M., Hiroshima H., "Diamond Nanoimprint Lithography", *Nanotechnology* 13, page 592 (2002) discloses how to successfully pattern diamond structures for the purposes of nanoimprint lithography. The process disclosed involves exposing the diamond surface coated in an electron beam resist to a lithographic pattern generated by an electron beam. The resist is then developed and the exposed diamond is subjected to an oxygen Reactive Ion Etch (RIE) which subsequently forms the patterned diamond mould. Typical pattern sizes are of the order of 2.0 µm can be produced on a diamond surface.

Another paper by Ando Y., Nishibayashi Y., Furuta H., Kobashi K., Hirao T., Oura K., "Spiky Diamond field Emitters", *Diamond and Related Materials* 12, page 1681 (2003) used a similar method to produce diamond field emitter tips. Rather than using a resist as a masking agent, aluminium spots were deposited onto the surface via conventional photo lithography. With this technique approximate 1.5 µm spots in size can be successfully applied to the surface. Another masking method discloses depositing metal on a diamond substrate to form a mask and subsequent Reaction Ion Etching (RIE) using an oxygen plasma, see for example disclosure in JP63220524. It has been found that it can be technically very difficult to deposit metal in the nano-scale. Such a deposition also requires a number of steps that are technically very complex to perform and achieve complex structures with dimensions in the nano-scale.

Stanishevsky A., "Focussed ion beam patterning of diamond like carbon films" *Diamond and related Materials* 8 page 1246 (1999) demonstrates patterning of diamond like carbon films by allowing a Ga$^+$ ion beam to sputter material that is exposed to the beam. When removing material across a large surface area, such sputtering has the disadvantage of being very time consuming relative to plasma etching. When milling to obtain elevated features uses a positive exposure (which is usually a larger area) which requires that far more material be removed.

Böttcher A., Heil M., Stürzl N., Jester S. S., Malik S., Pérez-Willard F., Brenner P., Gerthsen D., Kappes M. M., "Nanostructuring the graphite basal plane by focused ion beam patterning and oxygen etching", *Nanotechnology* 17 p5889 (2006) uses the combination of Ga$^+$ ion beam patterning and oxygen etching to obtain a patterned structure on a graphite surface. The function of the Ga+ ion beam is simply to increase the graphite surface susceptibility to the oxygen plasma etch where the beam strikes. A number of problems exist with this process. The oxygen etching is in the form of a high temperature (500° C.-700° C.) reaction with oxygen gas. The process utilises a positive exposure to the graphite rather than a negative exposure, thus the oxygen etch merely enhances the ion milling effect.

Nano-imprinting with Patterned Diamond potentially has many applications, for example in the microelectronics industry. There is a need in the microelectronics industries to provide a highly re-producible, low cost method for producing circuits, nanowires or transistors. The use of patterned diamond NIL stamps to form etch masks in resist layers for microelectronic circuit construction by lithographic processing is one way to address this problem.

The imprinting of micro- and nano-scaled patterns over large areas to produce high thermal conductivity interfaces is desirable in the industry, similar to that described by Brunschwiler et al. (2005)—Brunschwiler T., Kloter U., Linderman R., Rothuizen H., Michel B., "Hierarchically Nested Channels for Fast Squeezing Interfaces with Reduced Thermal Resistance", *21st IEEE SEMI-THERM Symposium* (2005). The generation of these interfaces is of particular interest to the microelectronics industry as the chip/transistor power density is currently being restricted by the rate of heat transfer across such interfaces.

European Patent Publication Number EP 0 400 791 describes a method specifically to fabricate "device functional materials" or "circuitry of interconnected devices" using two sequential processes. The first process uses irradiation, using accelerated ions, to create a surface modification, normally resulting in the removal of a masking layer, (i.e. of "a surface free of a masking layer greater than 100 nm"). Followed by a second process, uniform irradiation which selectively modifies areas exposed by the first process which results in a surface modification. This European patent requires a "masking layer" in which the "surface modification" is the local removal of this masking layer aided by the focussed ion beam exposure. The absence of this layer allows the selective modification which is etching material from the exposed areas where it is not protected by a mask.

A paper published by Wang et al in American Institute of Physics, Melville N.Y. Vol. 56, no. 8, 19 Feb. 1990, pages 749-751 describes a positive masking process, not dissimilar from that described in EP 0 4 00 791. Japanese patent publication number JP 63 281488 describes a process, very similar that described in EP 0 400 791 and Wang, whereby convergent beam of ions are used to create an amorphous layer over the area the beam is scanned. This amorphous layer is then selectively etched. In the example given the pattern is applied to a GaAs substrate, using a Si ion beam at 200 kV and the etch is wet using HCl above ambient temperature. The application is specifically to create line structures for a diffraction grating.

Another publication by NTIS TECH NOTES, US Department of Commerce, Springfield, Va., US, 1 Aug. 1988, page 640, 01/02 describes a process to create a mask to photochemical etching from the surface of a semiconducting substrate by changing the local electrical properties of the substrate via ion implantation. The etch is specifically using a gas with a "low concentration of a highly reactive gas". In the specific description given, Cl is the reactive gas where photochemical etching is induced by a laser which is applied to a GaAs substrate.

European Patent Publication No. EP 0 321 144 describes both positive and negative patterning to create semiconductor devices from multi-layer structures. The description makes reference to at least one layer being a pre-deposited mask which is essential. In examples given, the ion beam patterning referred provides a means of removing a layer below this first masking layer, not as a modification of the surface.

Another paper, Rennon et al, published in Microelectronic Engineering, Elsevier Publishers BV, Amsterdam, NL, vol. 57-58, pages 891-896, 2001 describes a method for patterning InP via the creation of a positive mask from the InP due to the implantation of Ga ions accelerated at 100 kV into the sample. It also requires a hot HF wet etch is required. Another paper published by Brugger et al in Microelectronic Engineering, Elsevier Publishers BV, Amsterdam, NL, vol. 35, pages 401-404, 1997 describes a positive masking process, where a Ga ion beam creates a mask/selective (wet) etch from KOH when applied to Si.

PCT patent publication number WO03/056611 describes a resistless method to create a semiconducting mask by doping a carrier material with an ion beam implantation then exposing it to a wet chemical etch to remove the undoped material. The process relies on a semiconducting layer to act as a hard mask, which its self can be the carrier layer. The ion beam effect relies on the doping of this semiconducting layer.

U.S. Pat. No. 5,580,419 describes a system to create integrated circuits using an ion beam. This system includes the steps: vacuum system and mounting system to transport wafers between chambers, and an ion beam to carry out the processes of FIB etching, Gas assisted ion beam etching and ion doping.

U.S. Pat. No. 4,622,918 discloses a processing chamber and means of transporting wafers between different process which can be applied within the single high vacuum chamber.

US patent Publication Number US2008/038926 discloses a treatment to an existing masking layer to enhance feature properties after subsequent etching. It creates part of a process of patterning a thin film which is coated by a masking layer (presumably pre-patterned by traditional resist based techniques). The enhanced masking layer protects the substrate from etching via an electron beam assisted plasma, primarily comprising of CxHy gasses. The context of the process is semiconductor/microelectronic processing.

It will be appreciated that many of the citations above are applicable to the semiconductor industry and producing integrated electronic circuits only and are not related to carbon based or otherwise hard surfaces. Other applications of patterning surfaces that suffer from the above mentioned problems and required complex processes to manufacture include:

Microelectromechanical systems (MEMS),

Photonics e.g. waveguides, or other microelectronics e.g. similar to those described by Ando Y., Nishibayashi Y., Furuta H., Kobashi K., Hirao T., Oura K., "Spiky Diamond field Emitters", *Diamond and Related Materials* 12 page 1681 (2003).

Precious gemstone/diamond marking, for example as described in U.S. Pat. No. 6,391,215 by James Gordon Charters Smith et al. (2002).

Heretofore, no process had been proposed to produce sharp, precise and high aspect ratio three dimensional scaled patterns on a carbon-based surface, for example a diamond surface, using a simple process to overcome the above mentioned problems.

SUMMARY OF THE INVENTION

The present invention provides, as set out in the appended claims, a process of patterning structures on a carbon based surface comprising exposing part of the carbon based surface to a $Ga^+$ or other energetic ion flux, such that material properties of the exposed carbon based surface are modified to provide a hard mask effect at the surface; and etching unexposed parts of the surface to form said structures, wherein said step of etching uses a plasma. The inventors have discovered that by controlling the Ga+ ion exposure alters the crystal and/or atomic structure of the top surface to provide a mask pattern or hard mask pattern, without substantially removing any material from the exposed surface. Ideally the step of ion exposure uses a Focussed Ion Beam (FIB) exposure. The hard mask allows for subsequent etching of unexposed areas of the surface, for example using an oxygen plasma, to produce patterns on a surface.

Suitably, the exposure comprises the step of using a low dose of $Ga^+$ ion exposure. The present invention found that, unlike conventional FIB milling, smaller ion currents (and doses) are needed to expose the surface than would otherwise be required for a FIB milling over a large area. It was found that these smaller ion currents inherently maintain a significantly higher resolution (approximately by a factor of 10) and require a much shorter exposure time (approximately by a factor of 100).

In one embodiment the Ga+ ion exposure alters the structure of the top of said carbon based surface to provide the hard mask effect on the surface subject to the exposed pattern, and without substantially removing any material from said surface.

In one embodiment there is provided the step of controlling the Ga+ ion exposure to alter the crystal and/or atomic structure of the top of the carbon based surface to provide a negative mask.

In one embodiment, in response to said Ga+ ion exposure, a thin layer of oxide is formed comprising metal oxide, for example gallium oxide or iron oxide, on said exposed carbon-based surface to form a negative mask to provide said hard mask effect.

In one embodiment the atomic structure of said carbon based surface swells in response to said Ga+ implantation, to produce said negative mask.

In one embodiment the hard mask effect is formed on a carbon based surface by energetic conversion of sp3 carbon bonds to lower energy state sp2 bonds at the surface.

It will be appreciated that the invention provides a simple process for the fabrication of sharp, precise and high aspect ratio three dimensional nano-scaled patterns on a surface, for example patterning nano-scaled structures on a diamond surface. Its basic capabilities are similar to those of conventional Focussed Ion Beam (FIB) patterning of diamond with the advantages of being exceptionally more efficient at the highest FIB resolutions, and avoiding common artefacts associated with milling large areas. The invention is particularly suitable for patterning nano-scale structures on a diamond surface.

In a preferred embodiment the oxygen plasma etching is performed at room temperature. Due to the low ion exposure dose it is possible to carry out the etching at room temperature. Ideally the plasma consists of a mixture of oxygen and tetrafluoromethane (CF4), oxygen and hexafluoroethane (C2F6), or oxygen and sulphur hexafluoride (SF6) plasma.

It will be appreciated that the $Ga^+$ exposure implants $Ga^+$ ions in the top layer of the surface. Typically the $Ga^+$ ions are implanted in the surface up to a depth of approximately 30 nm.

Suitably, the $Ga^+$ ion exposure alters the atomic and/or crystal structure of the top of said surface to provide a mask pattern, without substantially removing any material from said surface. Ideally, the ion exposure uses an approximately 30 kV $Ga^+$ FIB beam value or lower. Preferably, the ion exposure comprises a FIB ion beam having a spot size of less than 10 nm.

In another embodiment of the invention there is provided a process of patterning structures on a surface comprising exposing part of the surface to a $Ga^+$ or $He^+$ ion exposure, such that material properties of the exposed surface are modified to provide a mask effect at the surface; and etching unexposed parts of the surface to form said structures.

In a further embodiment the invention provides nano-structures produced on a diamond surface by exposing part of the diamond surface to a $Ga^+$ ion exposure, such that material properties of the exposed surface are modified to provide a mask effect surface; and etching unexposed parts of the surface to form said structures.

In yet a further embodiment of the present invention there is provided a system for controlling a process of patterning structures on a surface, said system comprising: means for exposing part of the surface to an energetic ion flux, such that material properties of the exposed surface are modified to provide a mask effect at the surface; and means for etching unexposed parts of the surface to form said structures.

It will be appreciated that in addition to enhancing many existing FIB techniques applied to diamond, the inventive FIB patterning exposure can be used to fabricate; stamps for the imprint fabrication of nano/microelectronic circuits or other devices, highly stable electron emitter tips for field emission display devices, and any number of applications for jewellery, for example for producing identifiable patterns on a gemstone surface for security or inventory purposes.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which:—

DETAILED DESCRIPTION OF THE DRAWINGS

The operation of the present invention will now be described in relation to the production of nano-scale patterns on a carbon based surface, for example a diamond surface, in order to best describe the operation of the invention in detail. It will be appreciated that the process of the present invention, using ion exposure for providing a mask pattern, can be applied to any carbon based surface to produce any size of pattern according to the application required.

Figure 1:
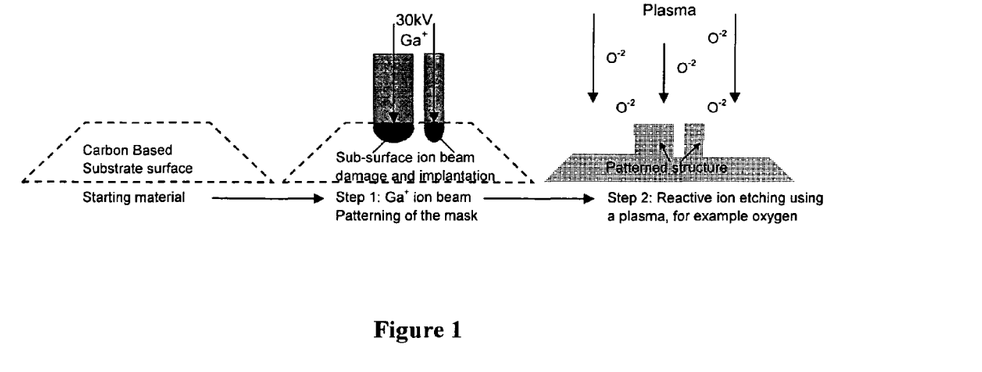
FIG. 1 is a schematic of the inventive fabrication system and process according to the present invention.

Referring now to FIG. 1 there is illustrated the two step process for the nano-fabrication of patterned carbon based surface, for an example a diamond surface, that consists of $Ga^+$ FIB patterning, or lithography, followed by an etching, for example a reactive ion etch in an oxygen plasma to form the patterned structures according to the present invention. The oxygen plasma etching is preferably performed at room temperature.

In a preferred embodiment the starting material is a flat single crystal diamond substrate or substrate. Step 1 of the process involves patterning the surface with a $Ga^+$ FIB. The incident ion beam (light shading) alters the crystal structure of a sub-surface region (dark shading) containing implanted $Ga^+$ which acts as a hard mask to the etching in Step 2. In Step 2 the patterned surface is exposed to a reactive ion etch using an oxygen or argon plasma. The resulting structure is formed with the masked/patterned area un-etched and raised relative to the un-patterned diamond. The Ga+ ion exposure alters the structure of the top of the carbon based surface to provide the hard mask effect on the surface subject to the exposed pattern, without substantially removing any material from the surface. By controlling the Ga+ ion exposure at a low dosage alters the crystal and/or atomic structure of the top of the carbon based surface to provide a negative mask. In response to Ga+ ion exposure a thin layer of oxide comprising metal oxide, for example gallium oxide or iron oxide, on the exposed carbon-based surface forms the negative mask to provide the hard mask effect.

Figure 2:
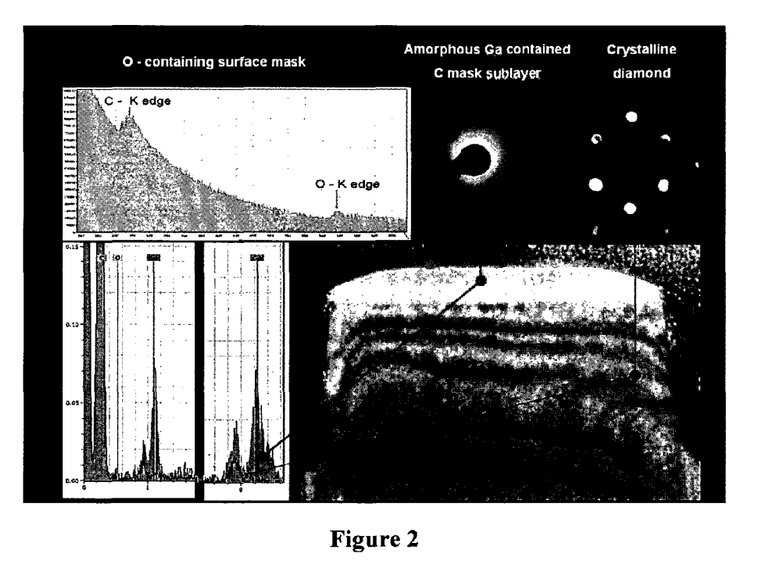
FIG. 2 illustrates a transmission electron microscope analysis, including electron diffraction, EELS EDX and bright field imaging of the cross-section of a masked diamond region according to the invention.

FIG. 2 illustrates a High Resolution Transmission electron microscope (HRTEM) analysis, including electron diffraction, EELS EDX and bright field imaging of the cross-section of a masked diamond region according to the invention. The EELS spectra of the surface ~3 nm shows the presence of oxygen forming the mask layer. EDX and electron diffraction patterns confirm the mask sublayer (~30 nm) is an amorphous mixture of Ga and C, and that the etched feature is crystalline diamond. Ultra-smooth surfaces of the etched diamond feature are formed, as shown. In addition, FIG. 2 shows detailed specification of target carbon based surfaces. The carbon based surfaces should be interpreted to mean any material whose structure contains a network of SP3 bonds, including: Single crystal diamond, polycrystalline diamond, nanocrystalline diamond, chemical vapour deposited (CVD) diamond, diamond-like carbon (DLC), doped versions of single crystal, polycrystalline, nanocrystalline, CVD diamond, DLC (eg.

Industry standard nitrogen, phosphorous, and boron doped diamond), graphite, graphene, fullerene based materials including single wall carbon nanotubes, multiwall carbon nanotubes, buckyballs, bucky-onions and cubic Boron Nitride.

The starting material used in the present invention is commercially available single crystal diamond. The flat diamond surfaces can be prepared, for example as follows:

The substrate is coated with a thick layer of gold to enhance the conductivity in the areas around the diamond in order for it to be sculpted and viewed with gallium ($Ga^+$) ion and scanning electron beams (respectively).

The crystal is milled with approximately 30 kV $Ga^+$ ion beam such that a flat surface is produced, as depicted in the schematic in FIG. 1. During this step, the surface is exposed to the FIB however such that only a minimal amount of ion beam damage or gallium implantation needs to be introduced to the sample, or at any significant depth, as the ion beam was incident parallel to the final surface.

Figure 3A:
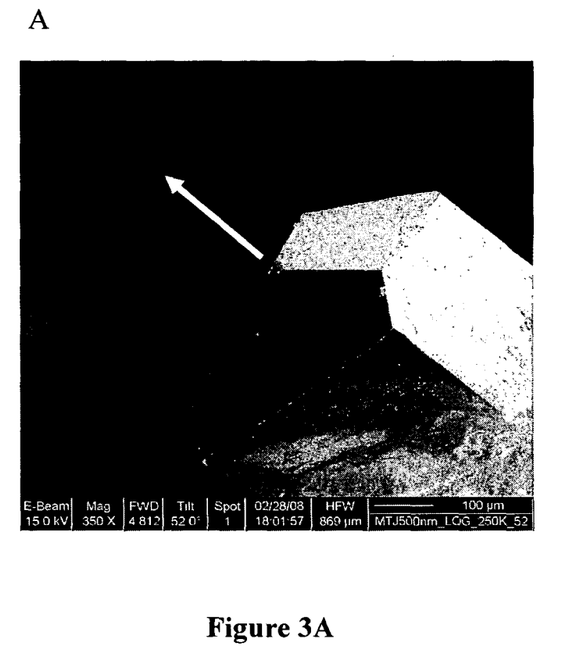
FIGS. 3A & 3B illustrate a diamond single crystal prepared as a flat surface by FIB milling, according to the invention.
Figure 3B:
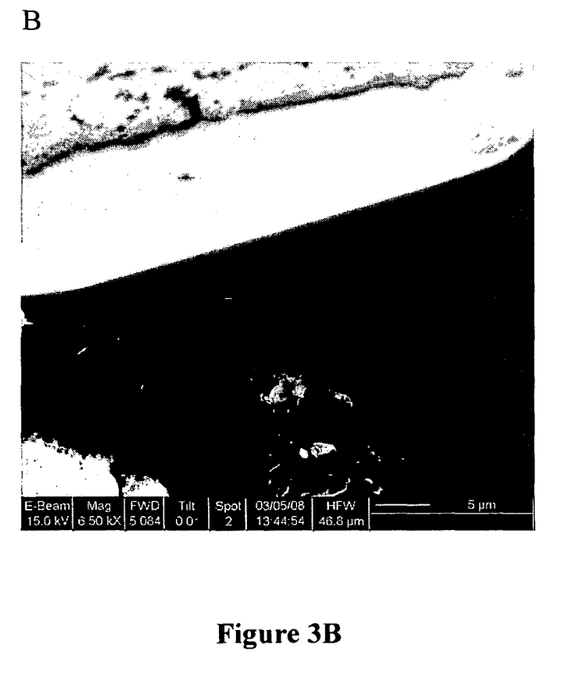

An image of the diamond single crystal with a surface prepared by the method of the invention can be seen in FIG. 3 "A". A higher magnification image of (in this case) a flat triangular surface is shown in FIG. 3 "B". This is the area that comprises the final patterns after Step 2.

FIG. 1 shows a starting carbon based material as illustrated in FIG. 3 which is a diamond single crystal prepared as a flat surface by FIB milling. "A" shows a lower magnification image of the prepared crystal with the arrow indicating the normal of the target surface. "B" shows a higher magnification image of the flat triangular surface which can be used for patterning the nano-structures.

The first step of the process, i.e. "Step 1" in FIG. 1, is to expose the flat surface of the starting material to a $Ga^+$ FIB, as indicated by the light shading. The FIB uses a 30 kV $Ga^+$ beam which has a spot size potentially down to approximately 2.5 nm, or even lower depending on the size constraints of the technology. The ion beam alters and/or damages the crystal structure of the diamond and also introduces Ga impurities near the diamond surface, in the area indicated by the dark shading in FIG. 1 "Step 1". One (or both) of these effects contribute to the mechanism that ultimately results in the masking of the diamond from the oxygen plasma etch which creates the final patterned surface.

The ion beam can be rastered across the prepared surface to expose shallow, complex patterns in the surface from which high quality, high aspect ratio shapes will ultimately be formed by the second step of the process.

These standard FIB patterning and lithography techniques are well established and extensively used in the research community and microelectronic fabrication industries alike. The inventors of the present application found that unlike conventional FIB milling, smaller ion currents (and doses) are needed to expose the surface than would otherwise be required for a FIB mill to produce an equivalent pattern. It was found that these smaller ion currents maintain a significantly higher resolution (approximately by a factor of 10) and require a much shorter exposure time (approximately by a factor of 100).

Figure 4:
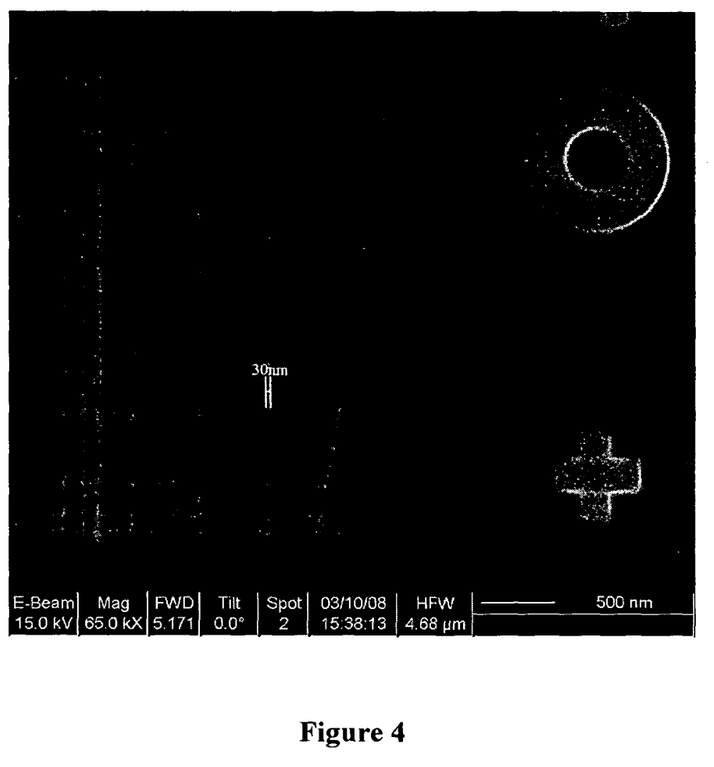
FIG. 4 is a Scanning Electron Microscope (SEM) image of patterns implanted onto the flat diamond surface demonstrating the capabilities of the of a FIB beam.

In a preferred embodiment of patterning, by patterning-step exposure and implantation by reactive ions such as gallium or indium, the masking effect in the subsequent plasma etch step may by facilitated by the formation of a metal oxide layer when exposed to an atmosphere containing oxygen at the surface that is highly resistant to the etch process, as shown in FIG. 4. The use of both reactive (oxygen) and non-reactive (argon) species, during the plasma etch step reveal the pattern illustrating that the layer acts as a negative mask to both reactive ion and physical sputtering modes of etching.

The masking effect may be enhanced by the significant amount of strain introduced into the implanted surface layer of the diamond or other lattice (~30% linear expansion in the case of 30 kV $Ga^+$ implanted diamond or amorphous carbon). This expansion allows the lattice to hold a significant amount of Gallium or indium as part of the masking layer (i.e. masking sublayer). It will be appreciate that the strain itself does not form the masking layer. The lattice expansion allows the surface layer to store a significant amount of Ga thus increases the capacity of the surface layer to act as a mask.

It will be appreciated that in the case of exposure of a diamond surface to non-reactive ion species, including He ions, the mask may be formed by local conversion of sp3 carbon bonds lower energy state sp2 bonds which are less susceptible to subsequent reactive ion etches such as oxygen ions.

FIG. 4 shows an ion beam patterned surface demonstrating line widths of 30 nm. This is approximately half the size of transistor gate and nanowire line widths that are currently being produced in the manufacture of microelectronic circuits. It is anticipated that this dimension can be reduced to less than 10 nm using the current process of the present invention. The dimensions produced are constrained by the current technology in FIB instrumentation. FIG. 4 illustrates Scanning Electron Microscope (SEM) image of patterns implanted onto the flat diamond surface demonstrating the capabilities of the FIB beam producing a 30 nm line width. In this instance, a 10 pA beam current was used. Ion flux densities for the lines were in the region of $2\times10^{15}$ Ga ions/$cm^2$.

The second step of the technique involves exposing the surface to an oxygen plasma, as depicted in FIG. 1 "Step 2". This oxygen plasma prompts reactive ion etching of the diamond surface. The areas not exposed to the ion beam are selectively etched leaving surface regions containing the initial patterned areas raised (i.e. not etched) relative to the un-exposed areas (etched). In other words, exposure to the ion beam forms a mask against plasma etching leading to a topography inverted pattern.

In application to the fabrication of patterns for nano-imprint lithography of microelectronic circuits, the production of an inverted pattern is a significantly more efficient means of producing a stamp than conventional FIB milling. In this instance only the circuits themselves need to be exposed which represents a minority of the total surface area. For conventional known FIB milling the other (majority) area needs to be exposed which requires larger milling areas and hence longer milling times.

Figure 5A:
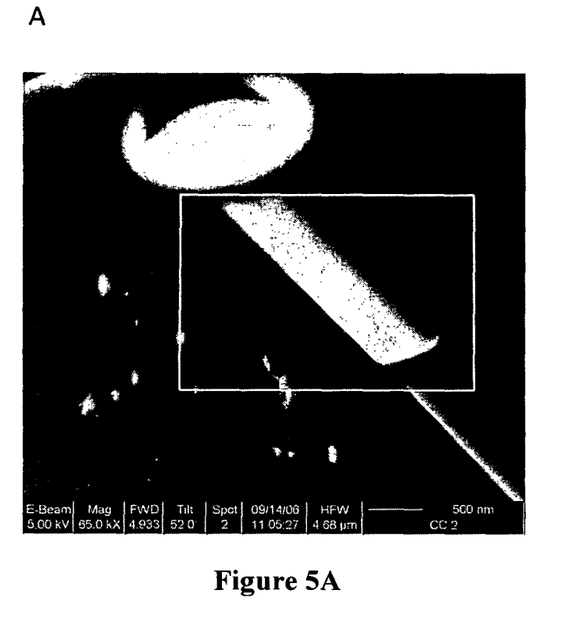
FIGS. 5A & 5B illustrate mask patterns on a diamond surface after a FIB beam and before plasma etching, according to the invention.
Figure 5B:
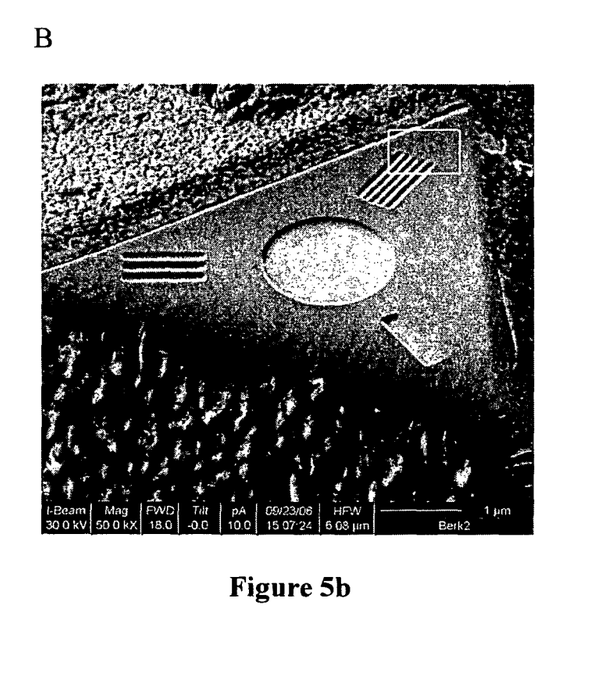

A Diener Electronic "Pico" plasma cleaner (2007) can be used to generate the oxygen plasma from a 54 kHz excitation in an atmosphere containing 0.2 mbar of oxygen. Images representing the surfaces before and after the oxygen plasma etch (i.e. Steps 1 and 2) are illustrated in SEM image FIGS. 5A & B and FIGS. 6 A & B, respectively. FIG. 5 A shows an SEM image showing circular and rectangular shapes and FIG. 5 B is an FIB image showing lines and a circular shape patterned onto a diamond surface. FIGS. 5A & B illustrates images of diamond surfaces after Step 1, the $Ga^+$ ion beam patterning and before the oxygen plasma etching.

Figure 6A:
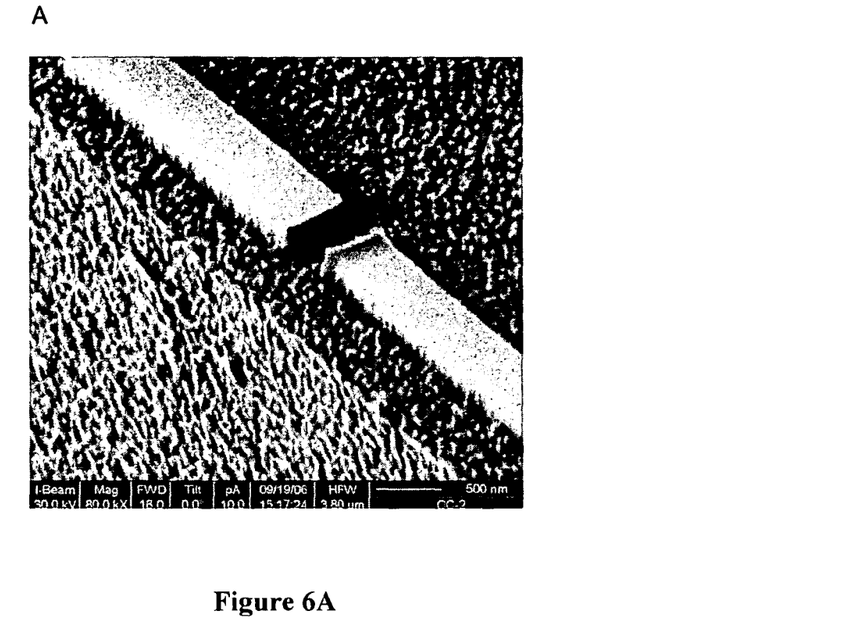
FIGS. 6A & 6B illustrates close-up nano-structure patterns formed shown in FIGS. 5A & 5B after plasma etching.
Figure 6B:
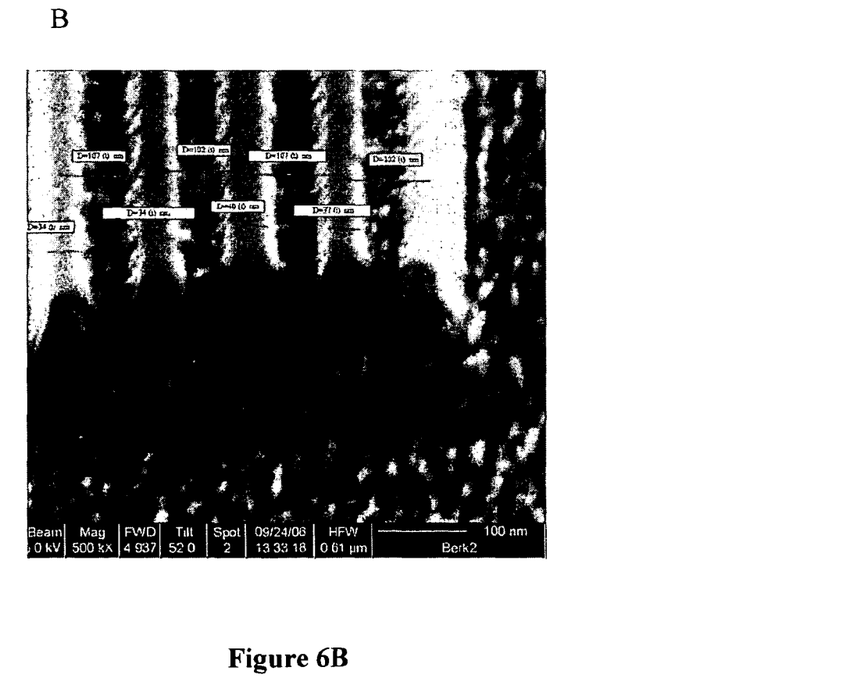

The images shown in FIGS. 6 A and B are close up images of 'boxes' in FIG. 5A and B respectively after plasma etching. FIG. 6 A shows that shapes have formed approximately 150 nm in height and accurately reflect the rectangular shaped exposure that was applied to the surface with the FIB after the plasma etching. Similarly, FIG. 6 "B" shows line scans with widths of approximately 30-40 nm that accurately reflect the dimensions of the initial FIB line scan. This demonstrates that the resolution limiting factor in this process is the dimensions of the line scan. Here, extremely high resolution lines of 30 nm width and 100 nm pitch have been formed. It can be seen that the nano-structures formed are well defined smooth vertical side walls and sharp corners at the edge of masked regions are produced. In addition, extreme surface smoothness of the masked regions is obtained along with a height to width aspect ratio of approximately 2:1 leading to deep channels between 100 nm pitch lines. In can be seen in these figures that the etched surface regions are left with a grassy roughness, that affects the top side and local side wall quality. This is a well known effect during pure oxygen plasma treating of diamond and can be completely eliminated by introduction of additional gases during the etch step, for example using a process disclosed in a paper by Ando Y., Nishibayashi Y., Kobashi K., Hirao T., Oura K., "Smooth and high-rate reactive ion etching of diamond", *Diamond and Related Materials* 11 page 824 (2002). It will be appreciated that other gases can be included in the oxygen plasma, for example CF4, C2F6 and SF6 to remove this roughness.

It will be further appreciated that in the context of the present invention a hard mask is a material used in semiconductor processing as an etch resistant mask in lieu of polymer or other organic "soft" materials. The idea is that polymers tend to be etched easily by oxygen, fluorine, chlorine or other reactive gases to the extent that a pattern defined using polymeric mask is rapidly degraded during plasma etching.

It will be appreciated that the application of the technique can be used to solve a diverse range of problems, in the field of nano-imprint lithography. Other areas where the invention can be applied are for optically invisible diamond marking/identification, or for introducing optical effects into surfaces, Micro-electro-mechanical systems (MEMS) or Photonics for use as waveguides. The invention can have many applications in the personal marking of jewellery items, for example names, significant dates (like anniversaries) etc and can be applied to any gemstone/precious stone surface, for example sapphire, ruby, emerald and opal. The patterns (especially nano-patterns) can prove to be an effective way of identifying stolen jewellery. The application of the present invention can provide security tags that are invisible to the human eye.

It will be further appreciated that another commercial application for a patterned diamond surface would be as a stamp for nano-imprint lithography or embossing of nano/microelectronic circuits. Such a process would have several advantages in that the patterns themselves would be adaptable to well established techniques of ion beam patterning and lithography. The stamps would be highly robust and resistant to wear or mechanical failure compared to current generation silicon or nickel stamps as they are made from the hardest known material, diamond. The nano-structures have unique thermal properties in that during thermally assisted NIL they will also resist fidelity degradation arising from thermoelastic strains (thermal fatigue) and efficiently deliver heat due to the high thermal conductivity of diamond, hence making the structures ideal for embossing. The nano-structure stamp patterns are highly reproducible making the process suitable for high throughput manufacture of such circuits.

In the context of the present invention Ga+ ions are described, it will be appreciated that other ion exposure can be used in order to provide the mask effect, for example He+ ions.

In a further embodiment of the invention, the patterned carbon based or hard surface comprises applications in biomedicine and biomedical devices. Diamond and DLC are biocompatible materials suitable for implants in the human body compared to metal. The technique of the present invention can be used to form nano-scaled to millimeter scaled patterns on the surfaces of medical devices for implanting in the human body, such as joint replacements in the hip and elsewhere, dental implants, arterial stents, and other implanted devices. Patterns formed at the nanoscale on carbon based surfaces using the process of the present invention, including in particular the 10-100 nm scale, can be used to promote or inhibit the adhesive binding of live cells, organisms, or other biological objects in the body, such as bone forming osteoblasts. This can allow implants that promote natural scaffold formation in the body where needed, or avoid unwanted build-up of biomaterial in regions such as flow channels like arteries and veins.

The embodiments in the invention described, and with reference to the drawings, comprise a computer apparatus and/or processes performed in a computer apparatus to control the patterning process according to the present invention. However, the invention also extends to computer programs, particularly computer programs stored on or in a carrier adapted to control the process according to the present invention. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

The invention is not limited to the embodiments hereinbefore described but may be varied in both construction and detail.

The invention claimed is:

1. A process of patterning nano-structures on a diamond or carbon based surface comprising:
    exposing part of said surface to an energetic ion flux using $He^+$ or $Ga^+$ or other ions, such that material properties of the exposed surface are modified to provide a hard mask effect at the surface, without removing substantially any material from the exposed surface;
    etching unexposed parts of the surface to form nano-structures, wherein said step of etching uses a plasma at room temperature;
    wherein said hard mask effect is formed on said surface by energetic conversion of sp3 carbon bonds to lower energy state sp2 bonds at the surface; and
    wherein the carbon based surface is selected from the group consisting of: polycrystalline diamond, nanocrystalline diamond, chemical vapour deposited (CVD) diamond, or diamond-like carbon (DLC).

2. The process of claim 1 wherein the $He^+$ or $Ga^+$ or other ion exposure alters the structure of the top of said carbon based surface to provide the hard mask effect to all the surface subject to the exposed pattern, without substantially removing any material from said surface.

3. The process of claim 1 comprising the step of controlling the $He^+$ or $Ga^+$ or other ion exposure to alter the crystal and/or atomic structure of the top of the carbon based surface to provide a negative mask.

4. The process as claimed in claim 3 wherein the atomic structure of said carbon based surface swells in response to said $He^+$ or $Ga^+$ or other ion implantation, to produce said negative mask.

5. The process as claimed in claim 1 wherein in response to said $Ga^+$ or other ion exposure forms a layer of oxide comprising metal oxide on said exposed carbon-based surface to form a negative mask to provide said hard mask effect.

6. The process of claim 1 wherein said step of exposing uses Focussed Ion Beam (FIB) exposure.

7. The process of claim 1 wherein said step of etching uses an oxygen or argon plasma.

8. The process as claimed in claim 1 wherein the plasma is produced by a Reactive Ion Etch (RIE) or an Inductively Coupled Plasma (ICP) or a barrel asher.

9. The process as claimed in claim 1 wherein the plasma etching consists of a mixture of oxygen and tetrafluoromethane ($CF_4$), oxygen and hexafluoroethane ($C_2F_6$), or oxygen and sulphur hexafluoride ($SF_6$) plasma.

10. The process as claimed in claim 1 wherein the $He^+$ or $Ga^+$ or other ion exposure implants $He^+$ or $Ga^+$ or other ion ions in the top layer of the surface.

11. The process of claim 10 wherein the $He^+$ or $Ga^+$ or other ion ions are implanted in the surface up to a depth of approximately 5 to 30 nm.

12. The process as claimed in claim 1 wherein the ion exposure uses an approximately 30 kV $He^+$ or $Ga^+$ or other ion FIB accelerating voltage or lower.

13. The process of claim 1 wherein the ion exposure comprises a FIB ion beam having a spot size of less than 10 nm.

14. The method of claim 5, wherein the metal oxide is gallium oxide or iron oxide.

15. The method of claim 1, wherein the hard mask is formed in the absence of a reactive atmosphere.

16. A process of patterning nano-structures on a diamond or carbon based surface consisting of:
- exposing part of said surface to an energetic ion flux using $He^+$ or $Ga^+$ or other ions, such that material properties of the exposed surface are modified to provide a hard mask effect at the surface, without removing substantially any material from the exposed surface;
- etching unexposed parts of the surface to form nano-structures, wherein said step of etching uses a plasma at room temperature;
- wherein said hard mask effect is formed on said surface by energetic conversion of sp3 carbon bonds to lower energy state sp2 bonds at the surface; and
- wherein the carbon based surface is selected from the group consisting of: polycrystalline diamond, nanocrystalline diamond, chemical vapour deposited (CVD) diamond, or diamond-like carbon (DLC).

* * * * *